United States Patent
Boecking

(10) Patent No.: US 6,597,086 B1
(45) Date of Patent: Jul. 22, 2003

(54) PIEZO ELEMENT WITH A MULTIPLE-LAYER STRUCTURE PRODUCED BY FOLDING

(75) Inventor: Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/018,650

(22) PCT Filed: May 20, 2000

(86) PCT No.: PCT/DE00/01628

§ 371 (c)(1),
(2), (4) Date: Mar. 1, 2002

(87) PCT Pub. No.: WO00/79612

PCT Pub. Date: Dec. 28, 2000

(30) Foreign Application Priority Data

Jun. 19, 1999 (DE) .......................... 198 28 181

(51) Int. Cl.$^7$ ...................... H01L 41/047; H01L 41/083
(52) U.S. Cl. ........................................ 310/366; 310/328
(58) Field of Search .............................. 310/328, 331, 310/332, 366

(56) References Cited

U.S. PATENT DOCUMENTS

| | | | | |
|---|---|---|---|---|
| 2,626,992 A | * | 1/1953 | Holman ........................ | 310/318 |
| 4,330,730 A | * | 5/1982 | Kurz et al. ................... | 310/330 |
| 4,469,978 A | * | 9/1984 | Hamada et al. .............. | 310/331 |
| 4,725,994 A | * | 2/1988 | Kaneko et al. .............. | 310/334 |
| 4,843,275 A | * | 6/1989 | Radice ........................ | 310/334 |
| 5,341,062 A | * | 8/1994 | Cero et al. ................... | 310/339 |
| 5,410,207 A | * | 4/1995 | Miura et al. ................. | 310/328 |
| 5,885,222 A | * | 3/1999 | Kassal et al. ................ | 600/528 |
| 6,107,726 A | * | 8/2000 | Near et al. ................... | 310/328 |
| 2001/0015597 A1 | * | 8/2001 | Matsui et al. ............... | 310/369 |
| 2002/0043901 A1 | * | 4/2002 | Kihara et al. ............... | 310/366 |

FOREIGN PATENT DOCUMENTS

| | | | | |
|---|---|---|---|---|
| DE | 3833109 A1 | * | 4/1990 | ................. 310/328 |
| EP | 0 844 678 A | | 5/1998 | ......... H01L/41/107 |
| JP | 56-27983 | * | 3/1981 | ................. 310/328 |
| JP | 11-122698 | * | 4/1999 | .......... H04R/17/00 |

OTHER PUBLICATIONS

Lee J., et al: "Multilayered Piezoelectric Flexure Device", Research Disclosure, vol. 187, Nov. 1979, pp. 627–628.
Patent Abstracts of Japan, vol. 013, No. 310 (M–850), Jul. 14, 1989 & JP 01 097604, Apr. 17, 1989.

* cited by examiner

Primary Examiner—Thomas M. Dougherty
(74) Attorney, Agent, or Firm—Michael J. Striker

(57) ABSTRACT

A piezoelectric element with a multi-layer construction of piezoelectric layers (2) that have electrodes (6, 7) disposed between them is proposed, which is provided with a contacting of the electrodes (6, 7) on alternating sides by means of external electrodes (8, 9). The individual piezoelectric layers (2) are comprised of a continuous foil made of ceramic, which can be folded during manufacture, and are completely or partially provided with the electrically conductive electrodes (6, 7); the external electrodes (8, 9) are attached to the metallized layer on the respective outsides in the bending region of the folded foil in order to produce the contact on alternating sides.

6 Claims, 1 Drawing Sheet

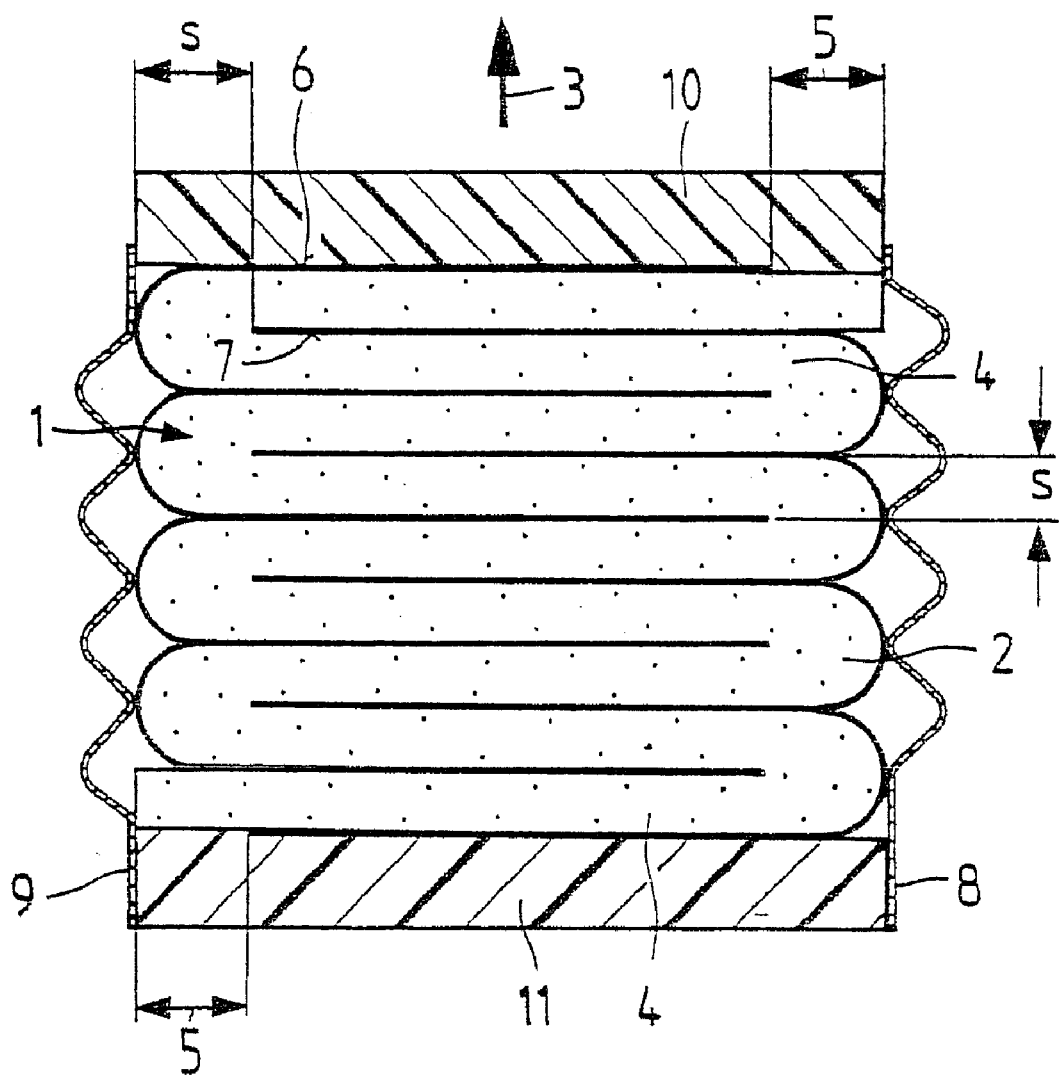

PIEZO ELEMENT WITH A MULTIPLE-LAYER STRUCTURE PRODUCED BY FOLDING

PRIOR ART

The invention relates to a piezoelectric element with a multi-layer construction of piezoelectric layers, and a method for producing it, for example to produce a piezoelectric actuator that is used to actuate a mechanical component such as a valve or the like, according to the generically defined features of the main claim.

It is generally known that a piezoelectric element can be comprised of a material with a suitable crystalline structure in order to exploit the so-called piezoelectric effect. When an external electrical current is applied, the piezoelectric element reacts mechanically, which produces a pressure or tension in a predeterminable direction depending on the crystalline structure and the region to which the electrical current is applied. The piezoelectric actuator here can be made up of multiple layers (multi-layer actuators) in which the electrodes used to apply the electrical current are respectively disposed between the layers. The internal electrodes here are respectively offset by a certain amount in relation to the external electrodes so that no short circuit occurs there. Stacking the individual piezoelectric layers is very expensive because several hundred individual foil layers must be separately processed.

Advantages of the Invention

The piezoelectric element described at the beginning, with a multi-layer construction of piezoelectric layers, which have electrodes disposed between them that are contacted on alternating sides, can advantageously be a component of a piezoelectric actuator which is used to actuate a mechanical component such as a valve or the like. According to the invention, the individual piezoelectric layers are comprised of a continuous foil made of piezoceramic that can be folded during manufacturing and are provided entirely or partially with electrically conductive electrodes.

In a preferred embodiment, the foil is advantageously made to be flexible through the application of solvents and, except for a predetermined region at the ends in the longitudinal direction, is metallized on both sides, for example also by means of printing or sputtering, in order to produce the electrodes. In this connection, the predetermined regions without electrode material are provided at the end of the folded layers to avoid causing short circuits in the piezoelectric element after the attachment of external electrodes.

On the respective outside, in the bending region of the folded ceramic layer, the external electrodes can be easily attached to produce the alternating-side contact with the metallized layer; the external electrodes can be comprised of an electrically conductive screen or mesh, or can be comprised of a corrugated electrode.

In order to insulate the entire piezoelectric element in relation to the outside, the multi-layer construction of piezoelectric layers is provided with an electrically insulating ceramic plate at the end of the folded layers.

In an advantageous method for producing a piezoelectric element of the type described above, the following manufacturing steps are executed:

The piezoelectric foil is made flexible by the solvent and is cut to the width of the piezoelectric element.

The piezoelectric foil is metallized on both sides except for the predetermined end regions.

The piezoelectric foil is folded by being bent at predetermined intervals.

The folded packet is laminated.

The folded packet is sintered.

The external electrodes are attached to the metallized layer in the bending region by means of soldering.

Alternatively, before the sintering: An electrically insulating top and bottom plate made of piezoceramic are affixed to the outer piezoelectric layers.

These and other features of preferred modifications of the invention ensue not only from the claims, but also from the specification and drawings. The individual features can each be realized and can prove to be advantageous as well as intrinsically patentable in and of themselves or in numerous combinations in the form of sub-combinations, both in the embodiment form of the invention and in other fields, protection for which is claimed herein.

DRAWING

An exemplary embodiment of the piezoelectric element according to the invention for producing a piezoelectric actuator will be explained in conjunction with the sole figure in the drawing, which depicts a section through a multi-layer construction of the piezoelectric element that is produced by folding.

DESCRIPTION OF THE EXEMPLARY EMBODIMENT

The sole Figure shows a piezoelectric element 1 for producing a piezoelectric actuator, which is comprised of a piezoelectric foil 2 of a ceramic material with a suitable crystalline structure so that by using the so-called piezoelectric effect, the application of an external electrical current causes the piezoelectric actuator to mechanically react in the direction of the arrow 3.

It is clear from the Figure that piezoelectric layers 4 are formed by a bending of the piezoelectric foil 2; the ceramic layer has been previously cut to the width of the piezoelectric element 1 and has been made flexible by means of a solvent. Before the bending, the piezoelectric foil 2 is metallized on both sides, except for the predetermined end regions 5, producing electrodes 6 and 7 which, after the folding, alternatingly function as internal electrodes 6 and 7. The electrodes 6 and 7 here are spaced apart from one another by a distance s, which corresponds to the thickness of the piezoelectric layers 4 and the radial spacing of the internal electrodes 6, 7 in the bending region.

After a sintering process, the folded packet of piezoelectric layers 4 is provided with external electrodes 8 and 9, which in the exemplary embodiment shown are respectively comprised of a metallic, corrugated electrode. In the respective bending region, the external electrodes 8 and 9 are connected in an electrically conductive manner to the metallized layer on the piezoelectric layers 4 so that an electrical current can be applied to the internal electrodes 6 and 7 in order to produce the piezoelectric effect.

An electrically insulating top plate 10 and bottom plate 11 are also respectively attached to the outer piezoelectric layers 4, as a result of which the entire piezoelectric element 1 can be stripped in relation to the outside.

What is claimed is:

1. A piezoelectric element with a multi-layer construction of piezoelectric layers (4) made of piezoceramic that have electrodes (6, 7) disposed between them, wherein the electrodes are contacted transversely on alternating sides by means of external electrodes (8, 9), wherein the individual piezoelectric layers (4) are comprised of a continuous foil (2), which can be folded during manufacture, and are completely or partially provided with the electrically conductive electrodes (6, 7), wherein the external electrodes (8, 9) are comprised of an electrically conductive screen or mesh, and wherein the multi-layer construction of the piezoelectric layers (4) is provided with an electrically insulating ceramic place (10, 11) at respective ends of the folded layers.

2. A piezoelectric element with a multi-layer construction of piezoelectric layers (4) made of piezoceramic that have electrodes (6, 7) disposed between them, wherein the individual piezoelectric layers (4) are comprised of a continuous foil (2), which can be folded during manufacture, and are completely or partially provided with the electrically conductive electrodes (6, 7), wherein the external electrodes (8, 9) are comprised of corrugated electrodes, and wherein the multi-layer construction of the piezoelectric layers (4) is provided with an electrically insulating ceramic place (10, 11) at respective ends of the folded layers.

3. The piezoelectric element according to claim 1, characterized in that the foil (2) is made flexible by means of a solvent, and except for a predetermined region (5) at the ends in a longitudinal direction, is metallized on both sides in order to produce the electrodes (6, 7) and that the external electrodes (8, 9) are attached to the metallized layer on the respective outsides in the bending region of the folded foil (2) in order to produce contact on alternating sides.

4. The piezoelectric element according to claim 1, characterized in that the piezoelectric element (1) is a component of a piezoelectric actuator, wherein said piezoelectric actuator is used to actuate a mechanical component such as a valve.

5. The piezoelectric element according to claim 2, characterized in that the foil (2) is made flexible by means of a solvent, and except for a predetermined region (5) at the ends in a longitudinal direction, is metallized on both sides in order to produce the electrodes (6, 7) and that the external electrodes (8, 9) are attached to the metallized layer on the respective outsides in the bending region of the folded foil (2) in order to produce contact on alternating sides.

6. A method for producing a piezoelectric element (1) according to claim 1, characterized in that the piezoelectric foil (2) is cut to the width of the piezoelectric element (1) and is made flexible by the solvent, wherein the piezoelectric foil (2) is metallized on both sides, except for the predetermined end regions (5), wherein the piezoelectric foil (2) is folded by being bent at predetermined intervals, wherein the folded packet is sintered after being laminated, wherein the external electrodes (8, 9) are attached to the metallized layer in the bending region by means of soldering, and wherein before the sintering, an electrically insulating top and bottom plate (10, 11) made of piezoceramic are affixed to the outer piezoelectric layers (4).

* * * * *